(12) United States Patent
Wilcox (10) Patent No.: US 6,529,442 B1
(45) Date of Patent: Mar. 4, 2003

(54) MEMORY CONTROLLER WITH AC POWER REDUCTION THROUGH NON-RETURN-TO-IDLE OF ADDRESS AND CONTROL SIGNALS

(75) Inventor: Jeffrey R. Wilcox, Hudson, OH (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/042,862

(22) Filed: Jan. 8, 2002

(51) Int. Cl.⁷ .................................................. G11C 8/00
(52) U.S. Cl. ....................................... 365/239; 365/227
(58) Field of Search ................................ 365/239, 227, 365/229, 233, 233.5

(56) References Cited

U.S. PATENT DOCUMENTS

| 5,473,572 A | 12/1995 | Margeson ................... 365/227 |
| 5,637,932 A * | 6/1997 | Koreeda et al. ............. 365/229 |
| 5,848,022 A | 12/1998 | Jiang ...................... 365/230.08 |
| 6,111,812 A | 8/2000 | Gans et al. .................. 365/233 |
| 6,233,661 B1 | 5/2001 | Jones et al. .................. 711/154 |
| 6,269,433 B1 | 7/2001 | Jones et al. .................. 711/168 |

* cited by examiner

Primary Examiner—Tan T. Nguyen
(74) Attorney, Agent, or Firm—Blakely, Sokoloff, Taylor & Zafman LLP (57) ABSTRACT

A memory controller and method for a memory device avoids returning the state of address and/or preselected control lines to idle when the chip select signal is de-asserted. The preselected control signals are selected from the control signals sent to the memory device that are ignored by the memory device when the chip select signal is de-asserted. By not returning to idle, power dissipation caused by toggling of signal lines is reduced.

28 Claims, 5 Drawing Sheets

MEMORY CONTROLLER WITH AC POWER REDUCTION THROUGH NON-RETURN-TO-IDLE OF ADDRESS AND CONTROL SIGNALS

FIELD OF THE INVENTION

The field of invention relates to electrical circuitry in general; and, more specifically, to memory controller circuits.

BACKGROUND

Memory controller circuits can be used in a variety of computer systems (e.g., desktop personal computers, notebook computers, personal digital assistants, etc.) to facilitate the computer system's processor in accessing memory chips. These memory chips may include random access memory (RAM) chips. For example, a memory controller can have an interface for connecting to one or more dynamic RAM (DRAM) chips such as, for example, synchronous DRAM (SDRAM) chips. The memory controller uses this memory interface to route data between the processor and RAM chips and to send address and control signals to the RAM chips. The control signals for accessing a RAM chip typically include row address strobe (RAS), column address strobe (CAS), write enable (WE) and chip select (CS) signals.

As in other electrical interfaces, the memory interface of a memory controller dissipates power during transitions (also referred to herein as toggling) of the interface signals. For example, in conventional memory controllers, during each memory cycle, the memory interface will drive the address and control signals at the beginning of the cycle and then return the signals to an idle state near the end of the cycle. For control signals, the idle state may be a logic high level, while for address signals, the idle state may a logic low level. Nevertheless, whatever the logic level of the idle state, returning these signals to the idle state generally causes toggling of many of these signals. As previously described, toggling results in power dissipation, which is generally undesirable in computer system applications and especially in battery-powered computer systems such as notebook computers and personal digital assistants. In addition, simultaneous toggling of such signals can result in increased noise and peak power dissipation. This problem can be further exacerbated in controllers for use with multiple system buses.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a memory controller circuit are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
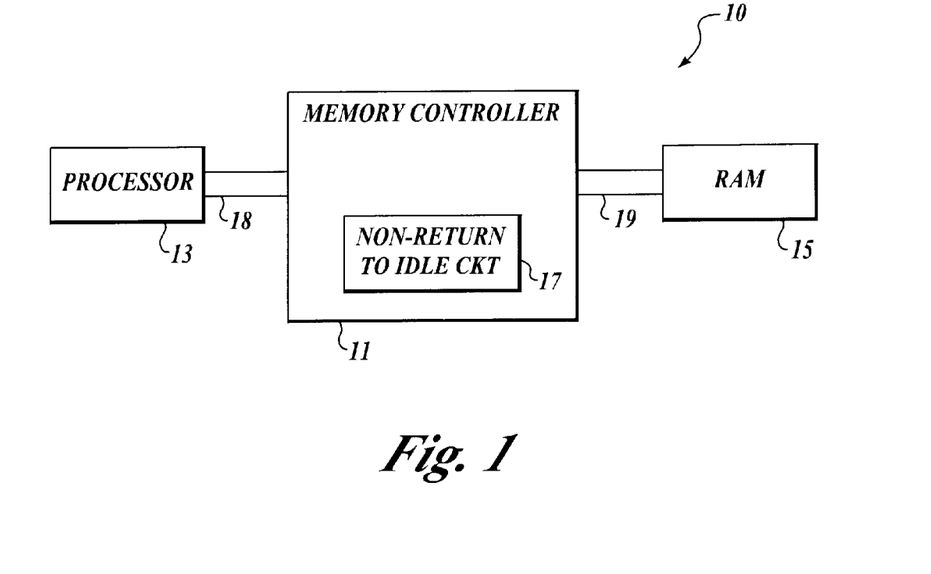
FIG. 1 is a simplified block diagram illustrating a memory controller as part of a computer system, according to one embodiment of the present invention.

FIG. 1 illustrates in simplified form a computer system 10 with a memory controller 11, according to one embodiment of the present invention. In addition, computer system 10 includes a processor 13 and a random access memory (RAM) 15. RAM 15 can be one of several types of RAM such as, for example, single or double data rate synchronous dynamic RAM (SDRAM), non-synchronous RAM, static RAM, etc. In accordance with the present invention, memory controller 11 includes a non-return-to-idle (NRI) circuit 17, which is part of the memory interface of memory controller 11. In other embodiments, different "agents" may use memory controller 11 to access RAM 15.

In one embodiment, NRI circuit 17 may be a separate sub-circuit within memory controller 11. Alternatively, the functionality of NRI circuit may be built into a state machine or sequencer that a memory controller typically includes to generate the control signals needed to interface with RAM 15 (e.g. the previously mentioned RAS, CAS, WE and CS signals).

The elements of computer system 10 are interconnected as follows. Processor 13 is connected to memory controller 11 through a bus 18 (also referred to herein as the processor bus). RAM 15 is connected to memory controller 11 through a bus 19 (also referred to herein as the memory bus). In particular, memory bus 19 is coupled to NRI circuit 17, which helps implement the memory interface of memory controller 11.

Figure 2:
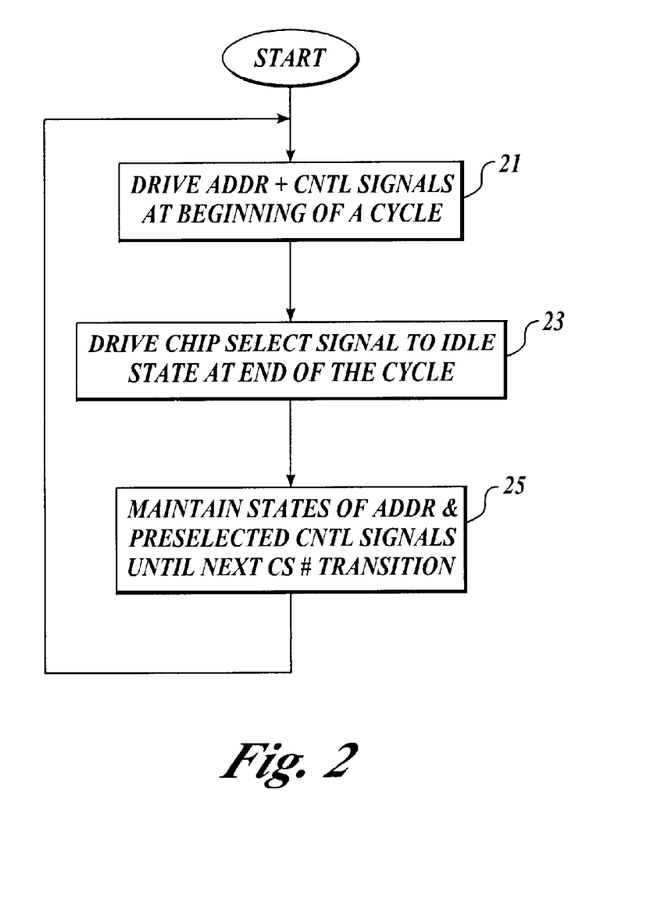
FIG. 2 is a flow diagram illustrating the operation of the memory controller of FIG. 1, according to one embodiment of the present invention.

FIG. 2 illustrates operations performed by memory controller 11 during a memory access. Referring to FIGS. 1 and 2, memory controller 11 operates as follows.

At the beginning a memory cycle, memory controller 11 drives the address and control signals received by RAM 15 via memory bus 19. As a result of this operation, many of these memory interface signals will toggle, thereby causing drivers of memory controller 11 to dissipate power as they drive the signals to the desired logic levels. A normal memory access operation (e.g., a read or write operation)

can then be performed during this memory cycle according to the command defined by the state of the control signals. This operation is represented by a block 21 in FIG. 2.

In one exemplary embodiment, RAM 15 is a synchronous RAM, with the memory cycles defined by a clock signal. In this embodiment, at the beginning of a memory cycle, memory controller 11 drives the address and control signals onto memory bus 19 with a relatively small propagation delay from the leading edge of a clock pulse. In addition, in this embodiment, the control signals include the complements of the aforementioned CS, RAS, CAS and WE signals (i.e., CS#, RAS#, CAS#, and WE# signals), which are used to interface with most commercially available RAM chips.

At the end of the memory cycle, memory controller 11 drives the CS# signal to its idle state, as in a conventional memory controller. This operation is represented by a block 23 in FIG. 2. In one embodiment, the idle state of the CS# signal is a logic low level.

In addition, at the end of the memory cycle, memory controller 11, through NRI circuit 17, maintains the states of the address and other preselected control signals at the same states as driven during block 21. These maintained states are also referred to herein as "parked" states. The preselected control signals are all control signals that are ignored by RAM 15 when the CS# signal is in the idle state. That is, the RAM memory interface protocol allows the address and some control signals to be in any state when the CS# signal is in the idle state. This operation is represented by a block 25 in FIG. 2.

In one embodiment, the preselected control signals are the RAS#, CAS#, and WE# signals. In other embodiments, the preselected control signals can be a subset of the RAS#, CAS#, and WE# signals. The control signals can also include other signals that are "returned-to-idle" such as, for example, a chip select signal, a clock enable (CKE), and data mask (DQM), as in a conventional memory controller system.

This embodiment of memory controller 11 advantageously prevents address and control signal toggling during memory cycles in which a new command is not being driven. The above operations do not cause any errors in a memory access operation because the preselected control signals are not used when the CS# signal is in the idle state. Each unnecessary toggle that is avoided by memory controller 11 represents a power savings. Further, memory controller 11 reduces the occurrence of simultaneous switching, which tends to reduce switching noise and peak power dissipation.

In addition, during the next memory cycle, some of the address and preselected control signals will typically remain in the same state as the parked state. Accordingly, these signals will not toggle even when a command is driven. For example, in many memory access situations (e.g., a block read or write of contiguous memory addresses), a sequence of memory access operations will require only a small number of the address signals to toggle between each memory access operation as the block read or write operation is performed. Thus, in such memory accesses, memory controller 11 significantly reduces the number of toggles compared to that caused by a conventional memory controller.

Figure 3:
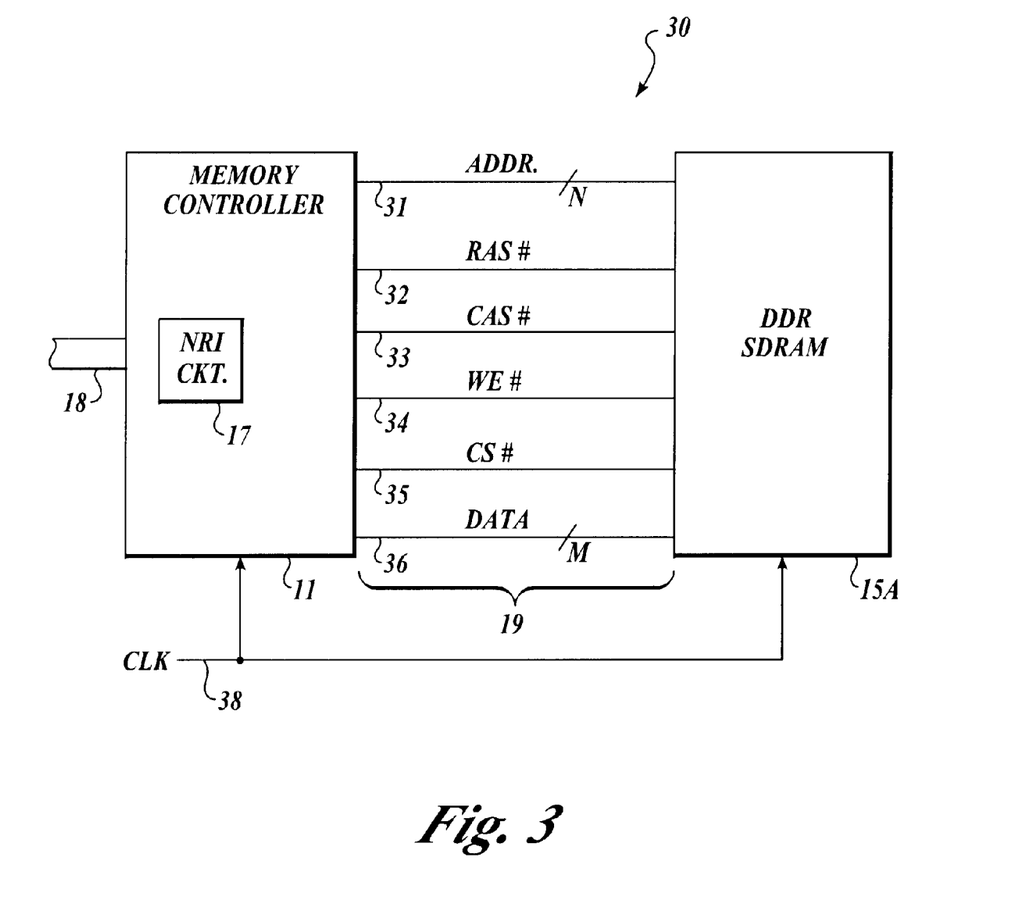
FIG. 3 is a simplified block diagram illustrating a memory interface of a memory controller, according to one embodiment of the present invention.

FIG. 3 illustrates a double data rate (DDR) SDRAM memory interface 30 of memory controller 11, according to one embodiment of the present invention. This embodiment includes memory controller 11 with NRI circuit 17, and a DDR SDRAM 15A. FIG. 3 illustrates part of a system that is essentially identical to system 10 (FIG. 1), except that in FIG. 3, RAM 15 (FIG. 1) is more particularly shown as a DDR SDRAM 15A. In some embodiments, DDR SDRAM 15A is implemented in more than one chip.

In this embodiment, memory interface 30 includes: (a) a N-bit address line or bus 31; (b) a RAS# line 32; (c) a CAS# line 33; (d) a WE# line 34; (e) a CS# line 35; and (f) a M-bit data line or bus 36. In addition, memory controller 11 and DDR SDRAM 15A receive a clock signal CLK via a line 38. In one embodiment, N and M represent fifteen and sixty-four, respectively. These lines electrically connect memory controller 11 with DDR SDRAM 15A. The RAS#, CAS# and WE# signals are the preselected control signals of this embodiment, and are part of the signals propagated on memory bus 19. The preselected control signals can be different in other embodiments, generally depending on the type of memory chip being used.

The memory interface illustrated in FIG. 3 also includes other control lines used to access a standard DDR SDRAM chip. However, these other control lines are omitted from FIG. 3 to avoid obscuring the invention.

In a manner as described above in conjunction with FIGS. 1 and 2, NRI circuit 17 parks preselected signals of memory interface 30 during a memory access operation to reduce toggling of the control signals. The timing of the signals on lines 31–36 during a block write operation is described below in conjunction with FIG. 4.

Figure 4:
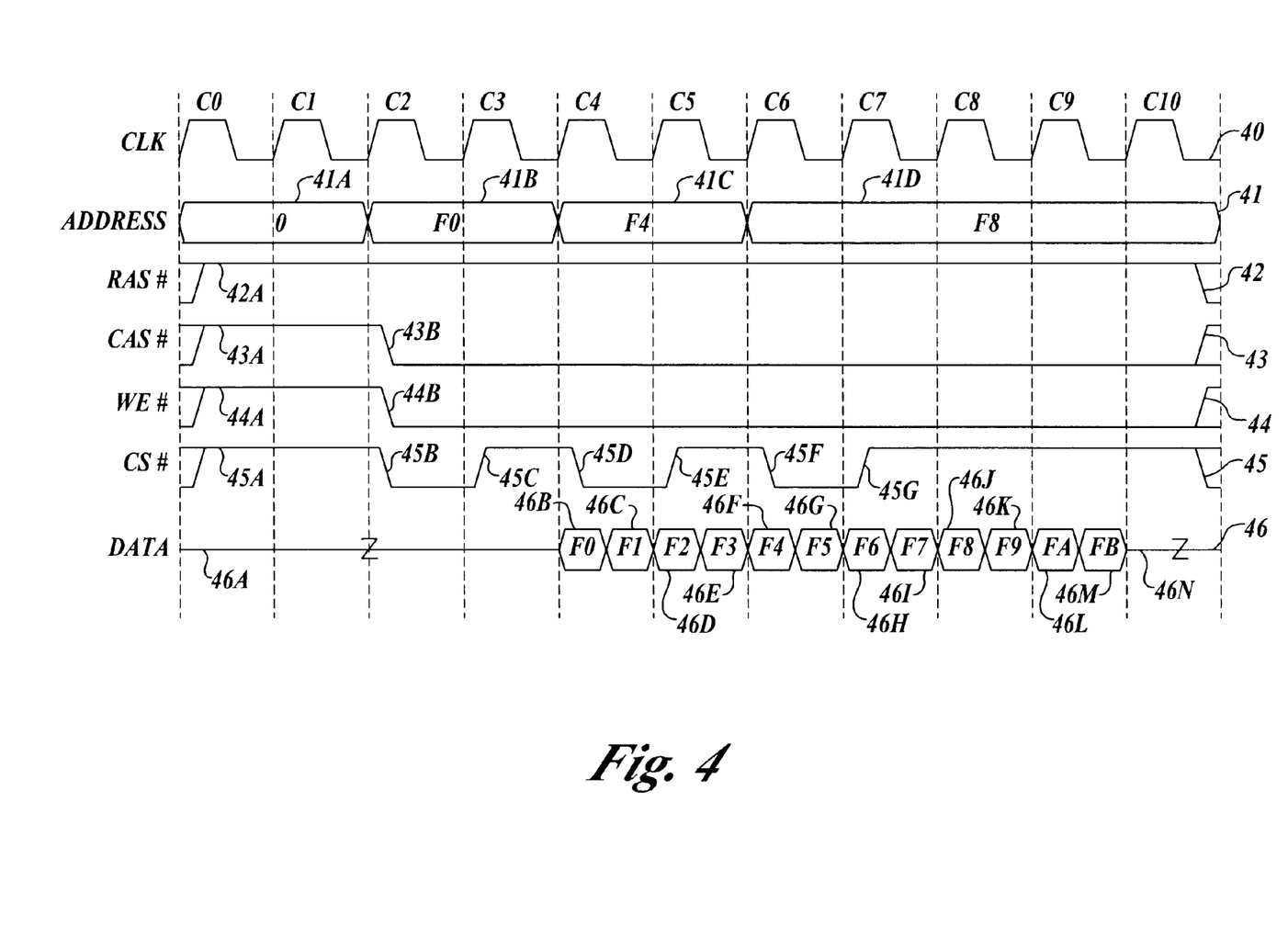
FIG. 4 is a timing diagram illustrating the operation of a memory controller during a write operation, according to one embodiment of the present invention.

FIG. 4 illustrates the timing of the memory interface signals shown in FIG. 3 during a write operation, according to one embodiment of the present invention. In particular, this exemplary write operation is a block write operation with a bust length of four to DDR SDRAM 15A.

Referring to FIGS. 3 and 4, these memory interface signals are represented in FIG. 4 as follows. A waveform 40 represents the timing of the clock signal CLK on line 38. In this exemplary timing diagram, the clock cycles of clock signal CLK are indicated in waveform 40 as clock cycles C0, C1, and so on. A waveform 41 represents the timing of the address signals on line 31. A waveform 42 represents the timing of the RAS# signal on line 32. A waveform 43 represents the timing of the CAS# signal on line 33. A waveform 44 represents the timing of the WE# signal on line 34. A waveform 45 represents the timing of the CS# signal on line 35. A waveform 46 represents the timing of the data signals on line 36.

Still referring to FIGS. 3 and 4, the block write operation begins during a cycle C0 of clock signal CLK. During clock cycle C0, memory controller 11 causes the address signals to return to idle, which is represented by address lines defining an address of zero in a section 41A of waveform 41. In addition, memory controller 11 drives the RAS#, CAS#, WE#, and CS# signals from their previous logic levels to a logic high level, as indicated by sections 42A, 43A, 44A and 45A of waveforms 42, 43, 44 and 45, respectively. Memory controller 11 causes its drivers for driving data lines 33 to be in a high-impedance state, represented by a section 46A of waveform 46 being at a mid-level. More particularly, in this exemplary embodiment, DDR SDRAM 15A has resistive terminations that cause the voltage level of data lines 33 to settle at one half of the logic high voltage level when the drivers of memory controller 11 are in a high impedance state. Memory controller 11 maintains these logic levels until the end of the clock cycle C1, as in a standard DDR SDRAM burst write operation.

Beginning with clock cycle C2, memory controller 11 causes the address of the first word to be written to DDR SDRAM 15A on address lines 31. This operation is indicated by a section 41B of waveform 41. Section 41B shows the address lines defining an address of F0, which represents the address of the first byte of the first word. Memory controller 11 maintains the logic high level of the RAS# signal and the high impedance state of the drivers for data lines 46. Memory controller 11 also drives the CAS#, WE# and CS# signals to a logic low level, as indicated by falling edges 43B, 44B and 45B. The voltages of the address, data and control signals during clock cycle C2 are driven to valid levels (e.g., SSTL_2 voltage levels) as in a standard DDR SDRAM burst write mode.

In clock cycle C3, however, memory controller 11 via NRI circuit 17 maintains the address signals at the same logic levels as in clock cycle C2. This operation is indicated by section 41B of waveform 41 extending to essentially the end of clock cycle C3. In contrast, typical conventional DDR SDRAM memory controllers would return the address lines to idle during cycle 3. As previously described, returning to idle would generally toggle some address signals, thereby dissipating power.

In addition, during clock cycle C3, memory controller 11 via NRI circuit 17 maintains the RAS#, CAS# and WE# signals at the same logic levels as in clock cycle C2. In a standard memory controller, the RAS# signal would generally have the same logic level; however, the CAS# and WE# signals would generally return to idle. Because memory controller 11 does not change the logic levels of CAS# and WE# during clock cycle C3, this embodiment of the present invention reduces toggling of these control signals, which in turn reduces power dissipation.

Also during clock cycle C3, memory controller 11 drives the CS# signal to a logic high level and maintains the high impedance state of the drivers for data lines 46 in a manner similar to a conventional DRR SDRAM memory controller. The transition of the CS# signal to a logic high level is indicated by a rising edge 45C in waveform 41.

In clock cycle C4, memory controller 11 causes the address of the second word to be written to DDR SDRAM 15A on address lines 31. This operation is indicated by a section 41C of waveform 41. Section 41C shows the address lines defining an address of F4, which represents the address of the first byte of the second word of the block. Memory controller 11 maintains the logic high level of the RAS# signal and the logic low levels of the CAS#, WE# signals. In addition, memory controller 11 drives the CS# signal to a logic low level, as indicated by a falling edge 45D of waveform 45. Memory controller 11 also causes the first two bytes of "write" data (i.e., to be written to addresses F0 and F1) to be placed on data lines 36, as represented by sections 46B and 46C of waveform 46. The voltage levels of the address, data and control signals during clock cycle C4 are driven to valid levels (e.g., SSTL_2 voltage levels) as in a standard DDR SDRAM burst write mode.

In clock cycle C5, memory controller 11 via NRI circuit 17 maintains the address signals at the same logic levels as in clock cycle C4. This operation is indicated by section 41C of waveform 41 extending from the beginning of clock cycle C4 to essentially the end of clock cycle C5. In addition, during clock cycle C5, memory controller 11 via NRI circuit 17 maintains the RAS#, CAS# and WE# signals at the same logic levels as in clock cycle C4. Further, memory controller 11 drives the CS# signal to a logic high level as indicated by a rising edge 45E of waveform 45. Memory controller 11 also causes the next two bytes of "write" data (i.e., data to be written to addresses F2 and F3) to be placed on data lines 36, as represented by sections 46D and 46E of waveform 46.

In clock cycle C6, memory controller 11 causes the address of the third word to be written to DDR SDRAM 15A on address lines 31. This operation is indicated by a section 41D of waveform 41. Section 41D shows the address lines defining an address of F8, which represents the address of the first byte of the third word of the block. Memory controller 11 maintains the logic high level of the RAS# signal and maintains the logic low levels of the CAS#, WE# signals. In addition, memory controller 11 drives the CS# signal to a logic low level, as indicated by a falling edge 45F of waveform 45. Memory controller 11 also causes the next two bytes of "write" data (i.e., data to be written to addresses F4 and F5) to be placed on data lines 36, as represented by sections 46F and 46G of waveform 46. The voltage levels of the address, data and control signals during clock cycle C6 are driven to valid levels (e.g., SSTL_2 voltage levels) as in a standard DDR SDRAM burst write mode.

In clock cycle C7, memory controller 11 via NRI circuit 17 maintains the address signals at the same logic levels as in clock cycle C6. This operation is indicated by section 41D of waveform 41 extending from the beginning of clock cycle C6 throughout clock cycle C7. In addition, during clock cycle C7, memory controller 11 via NRI circuit 17 maintains the RAS#, CAS# and WE# signals at the same logic levels as in clock cycle C6. Further, memory controller 11 drives the CS# signal to a logic high level as indicated by a rising edge 45G of waveform 45. Memory controller 11 also causes the next two bytes of "write" data (i.e., data to be written to addresses F6 and F7) to be placed on data lines 36, as represented by sections 46H and 46I of waveform 46. Thus, unlike a conventional DDR SDRAM memory controller, this embodiment of memory controller 11 (via NRI circuit 17) advantageously avoids toggling the address signals and the RAS#, CAS# and WE# signals during clock cycle C7.

In clock cycle C8, memory controller 11 maintains the address signals at the same logic levels as in clock cycle C7. This operation is indicated by section 41D of waveform 41 extending throughout clock cycle C8. Memory controller 11 maintains the logic high level of the RAS# and CS# signals and maintains the logic low levels of the CAS#, WE# signals. Memory controller 11 also causes the next two bytes of "write" data (i.e., data to be written to addresses F8 and F9) to be placed on data lines 36, as represented by sections 46J and 46K of waveform 46. Thus, in this embodiment, memory controller 11 via NRI circuit 17 avoid toggling the address lines and the RAS#, CAS# and WE#.

In clock cycle C9, memory controller 11 maintains the address signals and the RAS#, CAS#, WE#, and CS# signals remain at the same level as in clock cycle C8. However, memory controller 11 causes the next two bytes of "write" data (i.e., data to be written to addresses FA and FB) to be placed on data lines 36, as represented by sections 46L and 46M of waveform 46.

For most of clock cycle C10, memory controller 11 maintains the address signals and the RAS#, CAS#, WE#, and CS# signals remain at the same level as in clock cycle C9. However, memory controller 11 causes the drivers of data line 36 to enter the high impedance state as indicated by a section 46N of waveform 46. In addition, at the end of clock cycle C10, memory controller 11 would cause the address and the RAS#, CAS#, WE#, and CS# signals to be at the appropriate level for the operation to be performed in clock cycle C11. During clock cycle C10, the states of the RAS#, CAS#, WE#, and CS# signals and the drivers for data line 36 are similar to that of a conventional DDR SDRAM memory controller. However, the address signals were parked at the address of the third word (i.e., F8) rather than at the idle state as would be the case in a conventional DDR SDRAM memory controller.

Although a block write operation is described above, memory controller 11 (via NRI circuit 17) achieves a similar reduction in the number of toggles in the address signals and the RAS#, CAS#, and WE# signals during block read operations. For example, the timing of these address and control signals during a block read operation of burst length four would be essentially identical to the timing of FIG. 4, except the WE# signal would be inverted and DDR SDRAM 15A.

Memory controller 11 can be implemented to generate the timing of FIG. 4 using a state machine or sequencer. For example, the circuitry to generate this timing can be part of a custom memory controller chip or chips, or implemented using a programmable logic device, a gate array, an application specific integrated circuit (ASIC) etc. In one embodiment, this state machine or sequencer generates the address signals and preselected control signals (e.g. the RAS#, CAS#, and WE# signals) directly so that the address and preselected control signals do not toggle during clock cycles when the memory controller de-asserts the CS# signal. For example, the state machine can include a "new command" signal, which when unasserted causes the address and preselected control signals to remain parked at their current logic levels. These address and control signals remain parked until the new command signal is asserted (e.g., when a new command is driven).

Figure 5:
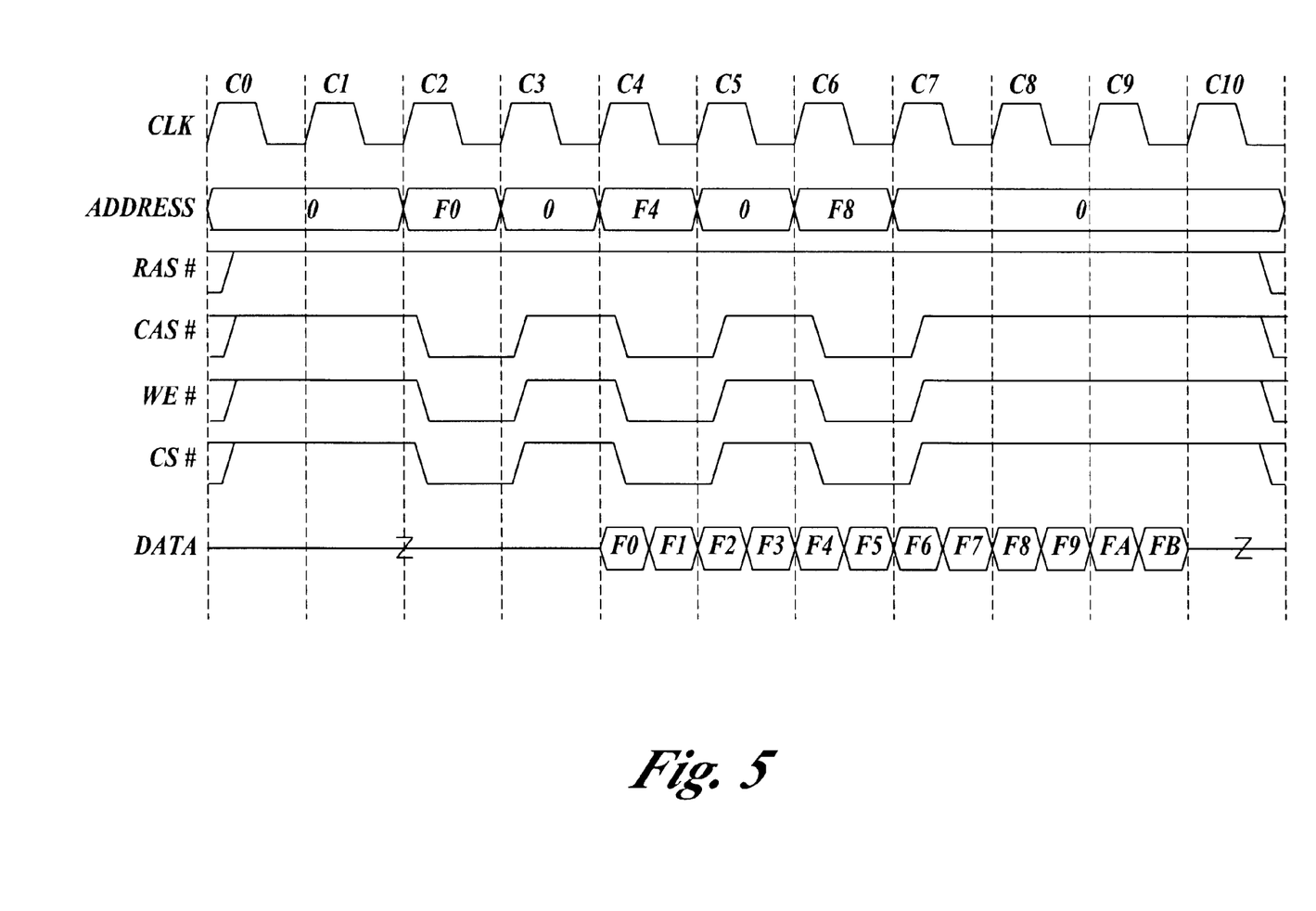
FIG. 5 is a timing diagram illustrating the operation of a conventional memory controller during a write operation, for comparison with the timing diagram of FIG. 4.

For comparison with FIG. 4, FIG. 5 illustrates the timing of a conventional DDR SDRAM memory controller in performing the same block write operation illustrated in FIG. 4. Unlike the timing memory controller 11 (FIG. 3), a conventional memory controller toggles at least some of the address signals and the RAS#, CAS#, and WE# signals during clock cycles C3 through C7, thereby causing more power dissipation than memory controller 11 when performing the same block write operation.

Figure 6:
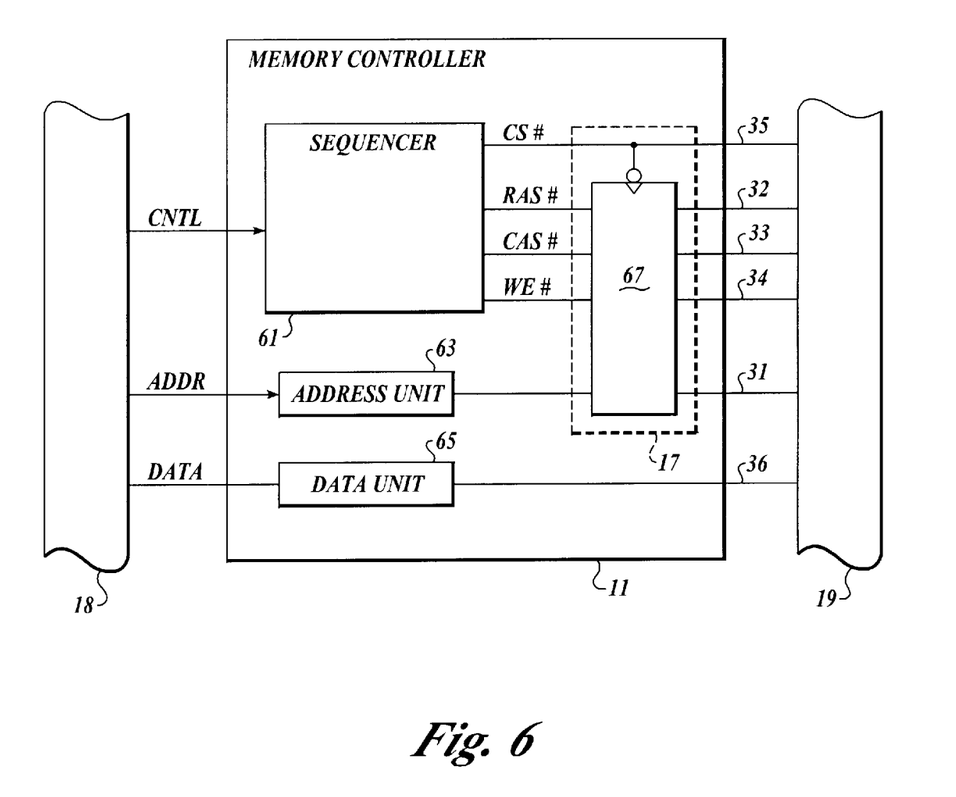
FIG. 6 is a simplified block diagram of a memory controller with latch circuit to implement a non-return-to-idle circuit, according to one embodiment of the present invention.

FIG. 6 illustrates an example alternative implementation of memory controller 11, according to one embodiment of the present invention. This embodiment is implemented as a simple modification of a conventional memory controller that does not require a change in the state machine or sequencer used to generate the address and control signals.

This embodiment of memory controller 11 includes a sequencer or state machine 61, an address unit 63, and a data unit 65 as in a conventional memory controller. In addition, in this embodiment, memory controller 11 includes NRI circuit 17, which includes a latch or register 67 that is clocked on the falling edge of the CS# signal.

The elements of this embodiment of memory controller 11 are interconnected as follows. Register 67 has data input terminals connected to receive the address signals and the RAS#, CAS# and WE# signals as generated by state machine 61. In addition, register 67 has data output terminals connected to lines 31 through 34 to provide address signals and the RAS#, CAS# and WE# signals, respectively, to RAM 15A (FIG. 3). Address unit 63 is connected to bus 18 to receive an address from the calling agent (e.g., processor 13 of FIG. 1). In one embodiment, address unit 63 is implemented as a switch or multiplexer to connect, in effect, the address lines of bus 18 to NRI circuit 17. Data unit 65 is connected between the data lines of bus 18 to the data lines of bus 19. In one embodiment, data unit 65 is also implemented as a switch or multiplexer to provide, in effect, a propagation path for data between bus 18 and bus 19.

In operation during a memory access, when state machine 61 asserts the CS# signal, register 67 stores the logic level of the address, CAS#, RAS# and WE# signals as generated by state machine 61 for that clock cycle. Thus, when the CS# signal is de-asserted, register 67 continues to output the stored logic levels of these signals to bus 19. Accordingly, during a memory access operation, the address signals and the CAS#, RAS# and WE# signals toggle only when the CS# signal is asserted. Thus, for example, this embodiment of memory controller 11 would cause the timing of a block operation to be substantially similar to the timing diagram of FIG. 4.

Although the embodiment described above includes a register to park the address and preselected control signals during clock cycles when the CS# signal is not asserted, other embodiments implement a state machine similar to state machine 61 that generates the address and preselected control signals with the appropriate timing without the use of a register clocked by the CS# signal.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a RAM; a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit, comprising:
   a memory interface coupleable to a memory device; and
   a sequencer coupled to the memory interface, wherein, in a memory access operation, the sequencer to:
   provide a plurality of address signals via the memory interface to the memory device during a first cycle of the memory access operation, wherein the address signals to have logic values defining an address of the memory device, provide via the memory interface a first control signal to the memory device during the first cycle, wherein the first control signal to select the memory device when asserted, de-assert the first control signal during a second cycle of the memory access operation, the second cycle to sequentially follow the first cycle; and cause the plurality of address signals to have logic values during the second cycle that are identical to their logic values during the first cycle.

2. The circuit of claim 1, wherein the sequencer further to:

provide a plurality of other control signals to the memory device via the memory interface, wherein during the first cycle the sequencer to cause the plurality of other control signals to have logic values that cause the memory device to perform a memory access operation; and cause the plurality of other control signals to have logic values during the second cycle that are identical to their logic values during the first cycle.

3. The circuit of claim 2, wherein the plurality of other control signals includes a second control signal to strobe a row of the memory device when asserted by the circuit during the memory access operation.

4. The circuit of claim 2, wherein the plurality of other control signals includes a third control signal to strobe a column of the memory device when asserted by the circuit during the memory access operation.

5. The circuit of claim 2, wherein the plurality of other control signals includes a fourth control signal to cause the memory device to perform a write operation when asserted.

6. The circuit of claim 2, wherein the sequencer further to:

assert the first control signal during a third cycle of the memory access operation, the third cycle to sequentially follow the second cycle;

cause the plurality of address signals to have logic values during the third cycle of which at least one logic value is different from that during the second cycle; and cause the plurality of other control signals to have logic values during the third cycle that are identical to their logic values during the second cycle.

7. The circuit of claim 2, wherein the sequencer further to:

assert the first control signal during a third cycle of the memory access operation, the third cycle to sequentially follow the second cycle; and cause the plurality of other control signals to have logic values during the third cycle that are identical to their logic values during the second cycle.

8. A circuit, comprising:

means for providing a plurality of address signals to a memory device during a first cycle of a memory access operation, wherein the address signals to have logic values defining an address of the memory device; and means for causing the plurality of address signals to have logic values during a next cycle of the memory operation that are identical to their logic values during the first cycle.

9. The circuit of claim 8, further comprising:

means for providing a plurality of control signals to the memory device, wherein during the first cycle the plurality of other control signals to have logic values that cause the memory device to perform a memory access operation; and means for causing the plurality of control signals to have logic values during the second cycle that are identical to their logic values during the first cycle.

10. The circuit of claim 9, wherein the plurality of control signals includes a control signal to strobe a row of the memory device when asserted by the circuit during the memory access operation.

11. The circuit of claim 9, wherein the plurality of control signals includes a control signal to strobe a column of the memory device when asserted by the circuit during the memory access operation.

12. The circuit of claim 9, wherein the plurality of control signals includes a control signal to cause the memory device to perform a write operation when asserted.

13. The circuit of claim 9, further comprising:

means for causing the plurality of address signals to have logic values during the third cycle of which at least one logic level is different from that during the second cycle; and means for causing the plurality of control signals to have logic values during the third cycle that are identical to their logic values during the second cycle.

14. The circuit of claim 9, further comprising:

means for asserting the first control signal during a third cycle of the memory access operation, the third cycle to sequentially follow the second cycle; and means for causing the preselected set to have logic values during the third cycle that are identical to their logic values during the second cycle.

15. A method, comprising:

providing a plurality of address signals to a memory device during a first cycle of a memory access operation, wherein the address signals having logic values defining an address of the memory device, providing a first control signal to the memory device during the first cycle, wherein the first control signal selecting the memory device when asserted, de-asserting the first control signal during a second cycle of the memory access operation, the second cycle sequentially following the first cycle; and causing the plurality of address signals to have logic values during the second cycle that are the same as the logic values of the plurality of address signals during the first cycle.

16. The method of claim 15, further comprising:

providing a plurality of other control signals to the memory device, wherein during the first cycle the plurality of other control signals to have logic values that cause the memory device to perform a memory access operation; and causing the plurality of other control signals to have logic values during the second cycle that are identical to their logic values during the first cycle.

17. The method of claim 16, further comprising:

asserting the first control signal during a third cycle of the memory access operation, the third cycle sequentially following the second cycle;

causing the plurality of address signals to have logic values during the third cycle of which at least one logic value is different from that during the second cycle; and causing the plurality of other control signals to have logic values during the third cycle that are identical to their logic values during the second cycle.

18. The method of claim 17, further comprising:

asserting the first control signal during a third cycle of the memory access operation, the third cycle sequentially following the second cycle; and causing the plurality of other control signals to have logic values during the third cycle that are identical to their logic values during the second cycle.

19. A method, comprising:

providing a plurality of address signals and a plurality of control signals to a memory device during a first cycle of a memory access operation, the plurality of address signals and the plurality of control signals having logic states, wherein the plurality of control signals includes a first control signal in an asserted state, the first control signal when asserted selecting the memory device during the memory access operation;

de-asserting the first control signal during a second cycle of the memory access operation, the second cycle sequentially following the first cycle; and maintaining the logic state of the plurality of address signals and a set of control signals of the plurality of control signals during the second cycle.

20. The method of claim 19, further comprising:

asserting the first control signal during a third cycle of the memory access operation, the third cycle to sequentially follow the second cycle;

causing the plurality of address signals to have logic values during the third cycle of which at least one logic value is different from that during the second cycle; and causing the set of control signals to have logic values during the third cycle that are identical to their logic values during the second cycle.

21. The method of claim 19, further comprising:

asserting the first control signal during a third cycle of the memory access operation, the third cycle sequentially following the second cycle; and causing the plurality of address signals to have logic values during the second cycle that are identical to their logic values during the second cycle; and causing the set of control signals to have logic values during the third cycle one of which is different from its logic values during the second cycle.

22. An apparatus, comprising:

means for providing a plurality of address signals and a plurality of control signals to a memory device during a first cycle of a memory access operation, the address and plurality of control signals having logic values, wherein the plurality of control signals includes a first control signal, the first control signal when asserted selecting the memory device during the memory access operation;

means for de-asserting the first control signal during a second cycle of the memory access operation, the second cycle sequentially following the first cycle; and means for maintaining the logic state of the plurality of address signals and a set of control signals of the plurality of control signals during the second cycle.

23. The apparatus of claim 22, further comprising:

means for asserting the first control signal during a third cycle of the memory access operation, the third cycle to sequentially follow the second cycle;

means for causing the plurality of address signals to have logic values during the third cycle of which at least one logic value is different from that during the second cycle; and means for causing the set of control signals to have logic values during the third cycle that are identical to their logic values during the second cycle.

24. The apparatus of claim 22, further comprising:

means for asserting the first control signal during a third cycle of the memory access operation, the third cycle sequentially following the second cycle; and means for causing the plurality of address signals to have logic values during the second cycle that are identical to their logic values during the second cycle; and means for causing the set of control signals to have logic values during the third cycle of which one logic value is different from its logic value during the second cycle.

25. A system, comprising:

a processor;

a memory device; and a memory controller coupled to the memory and the processor, wherein, in a memory access operation, the memory controller to:

provide a plurality of address signals to the memory device during a first cycle of the memory access operation, wherein the address signals to have logic values defining an address of the memory device, provide a first control signal to the memory device during the first cycle, wherein the first control signal to select the memory device when asserted, de-assert the first control signal during a second cycle of the memory access operation, the second cycle to sequentially follow the first cycle; and cause the plurality of address signals to have logic values during the second cycle that are identical to their logic values during the first cycle.

26. The system of claim 25, wherein the memory controller further to:

provide a plurality of other control signals to the memory device, wherein during the first cycle the plurality of other control signals to have logic values that cause the memory device to perform a memory access operation; and cause the plurality of other control signals to have logic values during the second cycle that are identical to their logic values during the first cycle.

27. The system of claim 26, wherein the memory device further to:

assert the first control signal during a third cycle of the memory access operation, the third cycle to sequentially follow the second cycle;

cause the plurality of address signals to have logic values during the third cycle of which at least one logic value is different from that during the second cycle; and cause the plurality of other control signals to have logic values during the third cycle that are identical to their logic values during the second cycle.

28. The system of claim 26, wherein the memory device further to:

assert the first control signal during a third cycle of the memory access operation, the third cycle to sequentially follow the second cycle; and cause the plurality of other control signals to have logic values during the third cycle that are identical to their logic values during the second cycle.

* * * * *